United States Patent
Sekine et al.

(10) Patent No.: US 10,866,408 B2
(45) Date of Patent: Dec. 15, 2020

(54) OPTICAL SCANNING DEVICE AND METHOD FOR PRODUCING OPTICAL SCANNING DEVICE

(71) Applicants: Hisamichi Sekine, Tokyo (JP); Maiko Nagawatari, Tokyo (JP); Seiya Sato, Tokyo (JP)

(72) Inventors: Hisamichi Sekine, Tokyo (JP); Maiko Nagawatari, Tokyo (JP); Seiya Sato, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 108 days.

(21) Appl. No.: 16/247,926

(22) Filed: Jan. 15, 2019

(65) Prior Publication Data
US 2019/0235232 A1 Aug. 1, 2019

(30) Foreign Application Priority Data
Jan. 29, 2018 (JP) .................... 2018-012926

(51) Int. Cl.
G02B 26/10 (2006.01)
G02B 26/08 (2006.01)
H01L 41/332 (2013.01)
H01L 41/113 (2006.01)
H01L 41/09 (2006.01)
(Continued)

(52) U.S. Cl.
CPC ....... *G02B 26/101* (2013.01); *G02B 26/0816* (2013.01); *G02B 26/0858* (2013.01); *H01L 41/083* (2013.01); *H01L 41/0933* (2013.01); *H01L 41/1132* (2013.01);
(Continued)

(58) Field of Classification Search
CPC .... G02B 26/08; G02B 26/10; G02B 26/0816; G02B 26/0858; G02B 26/101; H01L 41/083; H01L 41/09; H01L 41/113; H01L 41/332; H01L 41/0933; H01L 41/1132; H01L 41/0825; H01L 41/0953; B81B 3/0072; B81B 2201/032; B81B 2201/042; B81B 2203/058
See application file for complete search history.

(56) References Cited

U.S. PATENT DOCUMENTS

2010/0079558 A1* 4/2010 Shimada ............... B41J 2/1628
  347/71
2012/0026567 A1* 2/2012 Murayama ......... G02B 26/0858
  359/224.1
(Continued)

FOREIGN PATENT DOCUMENTS

JP 2015-169745 9/2015

*Primary Examiner* — Balram T Parbadia
(74) *Attorney, Agent, or Firm* — IPUSA, PLLC

(57) ABSTRACT

An optical scanning device includes: a mirror that has an optical reflection surface; a mirror support unit configured to support the mirror; a pair of drive beams arranged on both sides of the mirror support unit and connected such that the mirror support unit is swingable; a drive source provided on the drive beams and configured to swing the mirror support unit, the drive source including a stack structure of a plurality of piezoelectric thin films; and a piezoelectric sensor formed on a connection beam connected to the drive source or the drive beams, a number of piezoelectric thin films included in the piezoelectric sensor being less than a number of the piezoelectric thin films included in the drive source.

9 Claims, 8 Drawing Sheets

(51) Int. Cl.
  *H01L 41/083* (2006.01)
  *H01L 41/08* (2006.01)
(52) U.S. Cl.
  CPC ........ *H01L 41/332* (2013.01); *H01L 41/0825* (2013.01); *H01L 41/0953* (2013.01)

(56) References Cited

U.S. PATENT DOCUMENTS

| | | | |
|---|---|---|---|
| 2012/0112606 A1* | 5/2012 | Tang | H01L 41/0953 310/348 |
| 2012/0320440 A1* | 12/2012 | Kotera | G02B 26/101 359/224.1 |
| 2013/0083378 A1* | 4/2013 | Tanaka | G02B 26/101 359/199.4 |
| 2013/0271804 A1* | 10/2013 | Horie | H02N 2/108 359/199.4 |
| 2014/0368896 A1* | 12/2014 | Nakazono | G02B 26/0858 359/198.1 |
| 2015/0198801 A1* | 7/2015 | Naono | G01L 1/16 359/199.4 |
| 2017/0199375 A1* | 7/2017 | Naono | G02B 26/08 |

* cited by examiner

OPTICAL SCANNING DEVICE AND METHOD FOR PRODUCING OPTICAL SCANNING DEVICE

CROSS-REFERENCE TO RELATED APPLICATION

The present application is based on and claims priority to Japanese Application No. 2018-012926 filed on Jan. 29, 2018, the entire contents of which are hereby incorporated by reference.

BACKGROUND OF THE INVENTION

1. Field of the Invention

The present invention relates to an optical scanning device and a method for producing an optical scanning device.

2. Description of the Related Art

Conventionally, an optical scanning device is known that scans light by rotating a mirror portion around a rotation axis by a drive beam. In such an optical scanning device, a piezoelectric element using a piezoelectric thin film is used as a piezoelectric sensor or a drive source of a drive beam. A piezoelectric element is used as a drive source utilizing the inverse piezoelectric effect and drives a drive beam. In addition, a piezoelectric element is used as a piezoelectric sensor by utilizing the piezoelectric effect, and senses a displacement and a drive state of a drive beam.

A piezoelectric sensor outputs a signal such as a tilt angle of a MEMS (Micro Electro Mechanical Systems) mirror, a phase difference in a mirror plane tilt direction with respect to a drive signal, horizontal and vertical resonance frequencies, variations thereof, and uses it for feedback control in a control circuit. In a case where a piezoelectric element is used as a drive source, it is advantageous in terms of process because a piezoelectric sensor and the drive source that are piezoelectric elements can be formed at the same time.

A piezoelectric element having a multilayer structure in which an upper layer piezoelectric thin film and a lower layer piezoelectric thin film are stacked above and below a middle electrode and an upper electrode and a lower electrode are formed above and below that. When a piezoelectric element having a multilayer structure is used as a drive source, because the driving voltage efficiency is increased and low voltage driving is enabled, it is advantageous in preventing an element breakage due to withstand voltage. Also it is advantageous in reducing the load on a boost IC or a circuit.

As a piezoelectric sensor, a piezoelectric element having a multilayer structure can also be used. In a case where a piezoelectric element having a multilayer structure is used as a drive source, piezoelectric thin films located at the lower layer and the upper layer are used in parallel connection in order to improve the drive efficiency. On the other hand, the area where the piezoelectric sensor is formed is a narrow surface, wiring for parallel connection is difficult, and lower and upper layer piezoelectric thin films are connected in series. In this case, for example, because the thickness of the apparent piezoelectric thin film is doubled with respect to a case without a series connection, the sensor output voltage is ½ of the case without a series connection.

Patent Document 1 discloses an optical deflector in which a PZT piezoelectric film at the tip portion of a piezoelectric actuator is formed thinner than PZT piezoelectric films at other portions of the piezoelectric actuator.

RELATED-ART DOCUMENT

Patent Document

[Patent Document 1] Japanese Laid-open Patent Publication No. 2015-169745

However, in an optical scanning device as described above, it is required to improve the S/N ratio by increasing the output of a piezoelectric sensor.

In view of the above, an object of the present invention is to improve the S/N ratio by increasing the output of a piezoelectric sensor in an optical scanning device.

SUMMARY OF THE INVENTION

According to an aspect of the present invention, an optical scanning device (1000) includes: a mirror (110) that has an optical reflection surface; a mirror support unit (120) configured to support the mirror; a pair of drive beams (150A, 150B, 170A, 170B) arranged on both sides of the mirror support unit and connected such that the mirror support unit is swingable; a drive source (151A, 151B, 171A, 171B) provided on the drive beams and configured to swing the mirror support unit, the drive source including a stack structure of a plurality of piezoelectric thin films; and a piezoelectric sensor (191, 192, 195, 196) formed on a connection beam (140A, 140B) connected to the drive source or the drive beams, a number of piezoelectric thin films included in the piezoelectric sensor being less than a number of the piezoelectric thin films included in the drive source.

Note that the reference numerals in the above-described parentheses are attached to facilitate understanding; these are merely examples, and the depicted aspects are not limiting.

Advantageous Effects of Invention

According to the disclosed technique, it is possible to improve the S/N ratio by increasing the output of a piezoelectric sensor in an optical scanning device.

DETAILED DESCRIPTION OF THE EMBODIMENTS

Figure 1:
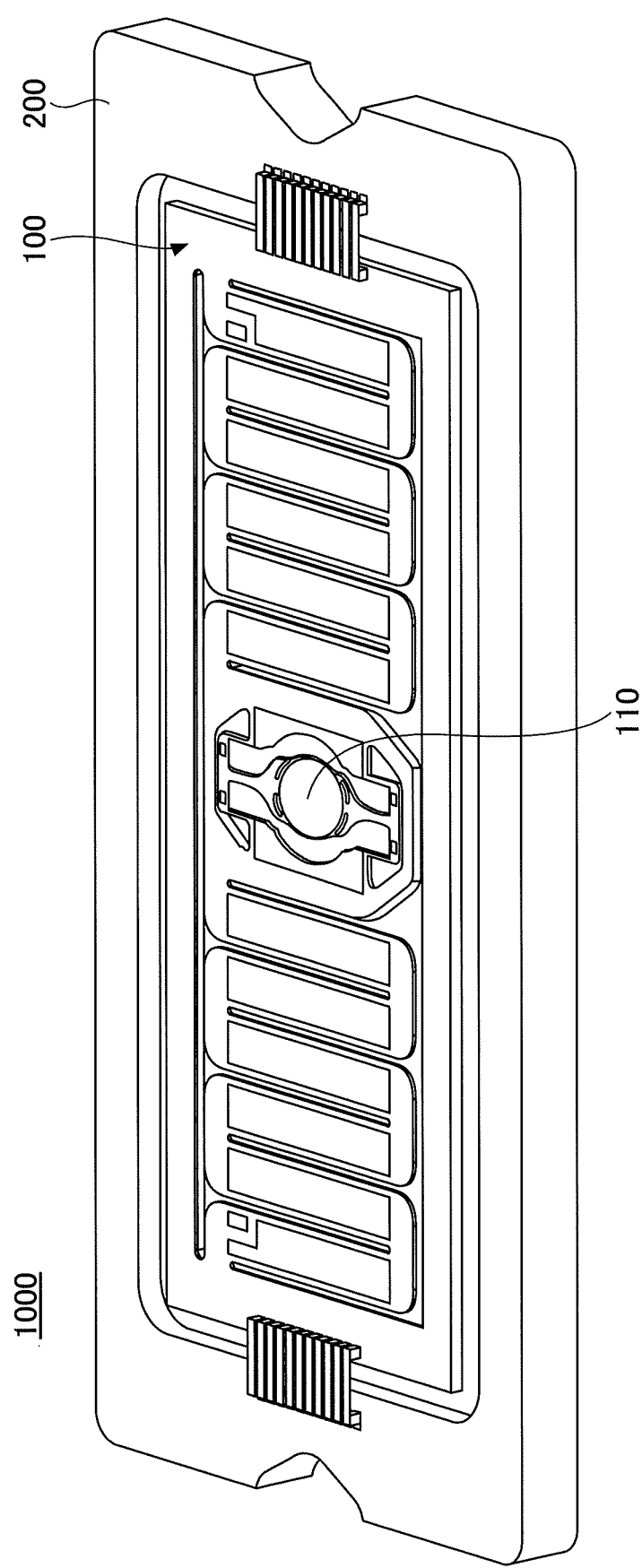
FIG. 1 is a perspective view (1) illustrating an example of an optical scanning device according to a embodiment.

In the following, an embodiment of the present invention will be described with reference to the drawings. Throughout the drawings, same reference numerals are given to same elements, and duplicated descriptions may be omitted as appropriate.

<Optical Scanning Device>

Figure 2:
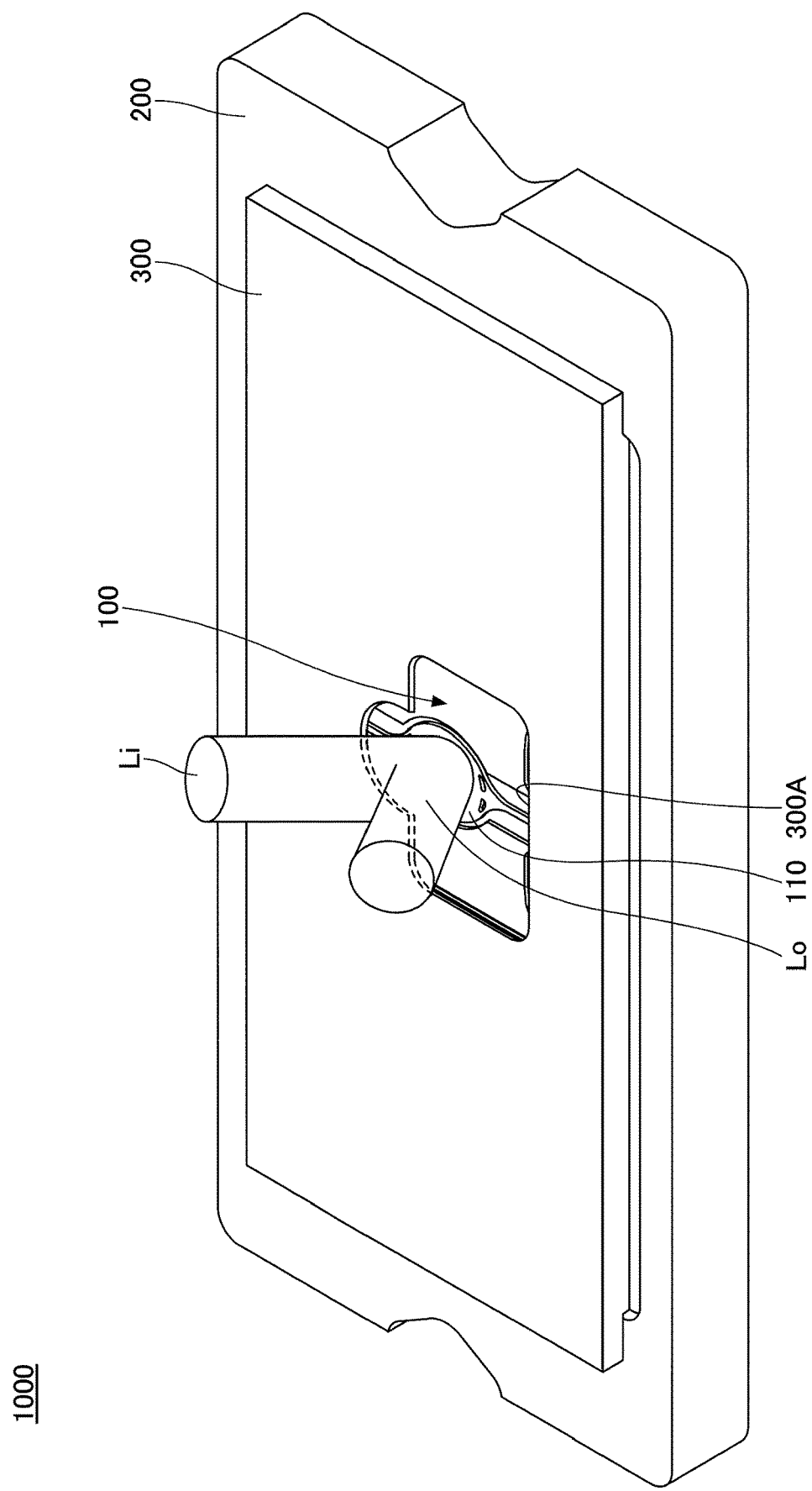
FIG. 2 is a perspective view (2) illustrating an example of the optical scanning device according to the embodiment.

First, an optical scanning device 1000 according to an embodiment will be described. FIG. 1 and FIG. 2 are perspective views illustrating an example of the optical scanning device 1000 according to the embodiment. FIG. 1 illustrates the optical scanning device 1000 in a state in which a package cover 300 is detached. FIG. 2 illustrates the optical scanning device 1000 in a state in which the package cover 300 is attached.

As illustrated in FIG. 1 and FIG. 2, the optical scanning device 1000 includes an optical scanning unit 100, a ceramic package 200 on which the optical scanning unit 100 is mounted, and the package cover 300 that is arranged on the ceramic package 200 and that covers the optical scanning unit 100. The optical scanning device 1000 may include a substrate, a control circuit, etc., on a lower side of the ceramic package 200.

In the optical scanning device 1000, at substantially the center part of the package cover 300, an opening 300A is provided from which the vicinity of a mirror 110 that has an optical reflection surface is exposed. It is assumed that the opening 300A has a shape such that incident laser light Li that is incident onto the mirror 110 and outgoing laser light Lo (scanning light) are not blocked.

It should be noted that, in the opening 300A, the side, through which the incident laser light Li passes, has a smaller opening than that of the side through, which the outgoing laser light Lo passes. In other words, the incident laser light Li side of the opening 300A has a smaller opening with a substantially semicircular shape, and the outgoing laser light Lo side of the opening 300A has a larger opening with a substantially rectangle shape. This is because the incident laser light Li enters from a fixed direction, and thus, the opening should be provided only for the fixed direction. On the other hand, the outgoing laser light Lo is scanned in two dimensions, and thus, the opening is required to be provided for the entire range to be scanned so that the outgoing laser light Lo, which is scanned in two dimensions, is not blocked.

<Optical Scanning Unit>

Figure 3:
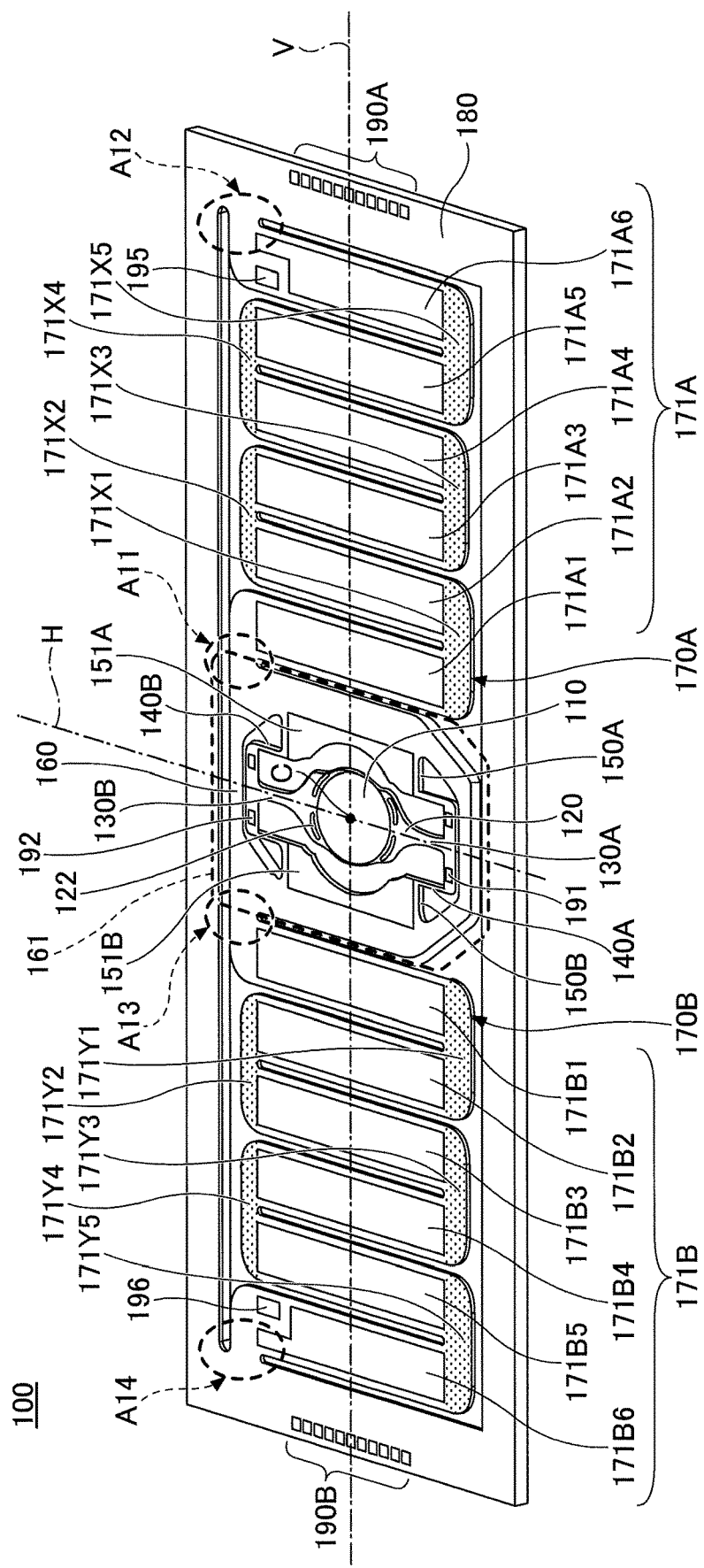
FIG. 3 is an upper surface side perspective view illustrating an example of an optical scanning unit of the optical scanning device according to the embodiment.

Next, the optical scanning unit 100 of the optical scanning device 1000 will be described. FIG. 3 is an upper surface side perspective view illustrating an example of the optical scanning unit 100 of the optical scanning device 1000 according to the embodiment.

As illustrated in FIG. 3, the optical scanning unit 100 is a portion that scans laser light emitted from a light source by swinging the mirror 110. The optical scanning unit 100 may be, for example, a MEMS (Micro Electro Mechanical Systems) mirror that drives the mirror 110 by using a piezoelectric element.

The optical scanning unit 100 includes the mirror 110, a mirror support unit 120, twist beams 130A and 130B, connection beams 140A and 140B, horizontal drive beams 150A and 150B, the movable frame 160, the vertical drive beams 170A and 170B, and the fixed frame 180. In the present embodiment, the mirror support unit 120, the twist beams 130A and 130B, the connection beams 140A and 140B, the horizontal drive beams 150A and 150B, and the movable frame 160 are collectively referred to as a mirror support 161 that supports the mirror 110.

On both sides of the mirror support 161, a pair of vertical drive beams 170A and 170B connected to the mirror support 161 are disposed. The mirror support 161 and the vertical drive beam 170A are connected by a mirror support connection portion A11. The fixed frame 180 and the vertical drive beam 170A are connected by a fixed frame connection portion A12. The mirror support 161 and the vertical drive beam 170B are connected by a mirror support connection portion A13. The fixed frame 180 and the vertical drive beam 170B are connected by a fixed frame connection portion A14. Details of the vertical drive beams 170A and 170B will be described later below.

On both sides of the mirror support unit 120 that supports the mirror 110, the pair of horizontal drive beams 150A and 150B connected to the mirror support unit 120 are disposed. Also, the horizontal drive beams 150A and 150B, the connection beams 140A and 140B, the twist beams 130A and 130B, the mirror support unit 120, and the mirror 110 are supported by the movable frame 160 from outside. That is, one side of the horizontal drive beam 150A and one side of the horizontal drive beam 150B are connected to and supported by the inner periphery of the movable frame 160. The other side of the horizontal drive beam 150A extends toward the inner periphery and is connected to the connection beams 140A and 140B. Similarly, the other side of the horizontal drive beam 150B extends toward the inner periphery and is connected to the connection beams 140A and 140B. The connection beams 140A and 140B are connected to the twist beams 130A and 130B that extend in the direction of the horizontal rotation axis H, and the twist beams 130A and 130B support the mirror support unit 120 from both sides in the direction of the horizontal rotation axis H. As described above, the horizontal drive beams 150A and 150B are provided as a pair in a direction orthogonal to the direction of the horizontal rotation axis H, in which the twist beams 130A and 130B extend, in such a way that the mirror 110 and the mirror support unit 120 are sandwiched by the horizontal drive beams 150A and 150B. The direction of the horizontal rotation axis H will be described later below.

The horizontal drive beams 150A and 150B include horizontal drive sources 151A and 151B, respectively. Further, the vertical drive beams 170A and 170B include vertical drive sources 171A and 171B, respectively. The horizontal drive beams 150A and 150B and the vertical drive beams 170A and 170B function as actuators that swing the mirror 110 in an up-and-down direction (vertical direction) and in a left-and-right direction (horizontal direction) to scan laser light.

The horizontal drive sources 151A and 151B are formed on the upper surfaces of the horizontal drive beams 150A and 150B, respectively. The horizontal drive sources 151A and 151B include thin films of piezoelectric elements (hereinafter, referred to as "piezoelectric thin films") on the upper surfaces of the horizontal drive beams 150A and 150B, and first electrodes and second electrodes connected to the piezoelectric thin films. Details of the horizontal drive sources 151A and 151B will be described later below. The horizontal drive sources 151A and 151B expand and contract according to the polarity of a drive voltage applied to the first electrodes and the second electrodes.

Therefore, by applying, to the horizontal drive beam 150A and the horizontal drive beam 150B, drive voltages of sine waves that have opposite phases, the horizontal drive beam 150A and the horizontal drive beam 150B, disposed on the left side and the right side of the mirror 110, alternately oscillate in opposite vertical directions. According to this operation, it is possible to swing (rotate) the mirror 110 around the twist beams 130A and 130B as a swing axis or a rotational axis in the direction of the horizontal rotation axis H. Hereinafter, the direction, in which the mirror 110 swings around the twist beams 130A and 130B as an axis, is referred to as the horizontal direction, and the swing axis that passes through the center C of the optical reflection surface of the mirror 110 is referred to as the horizontal rotation axis H. Resonance vibration, for example, can be used for the horizontal drive by the horizontal drive beams 150A and 150B such that the mirror 110 can be driven to swing at high speed.

In the mirror support unit 120, slits 122 are formed along the circumference of the mirror 110. According to the slits 122, not only the weight of the mirror support unit 120 can be reduced, but also the twisting caused by the twist beams 130A and 130B can be transmitted to the mirror 110.

Also, the vertical drive beam 170A has a zigzag shape as a whole in which a plurality of vertical beams extending in the direction of the horizontal rotation axis X are included and in which the end portions of the adjacent vertical beams are connected with each other.

For example, the end portion of the first vertical beam counted from the mirror support 161 side and the end portion of the second vertical beam are connected by a turn portion 171X1. Also, the end portion of the second vertical beam and the end portion of the third vertical beam are connected by a turn portion 171X2. Also, the end portion of the third vertical beam and the end portion of the fourth vertical beam are connected by a turn portion 171X3. Also, the end portion of the fourth vertical beam and the end portion of the fifth vertical beam are connected by a turn portion 171X4. Also, the end portion of the fifth vertical beam and the end portion of the sixth vertical beam are connected by a turn portion 171X5. Note that in FIG. 3, each turn-back portion is indicated by a satin-like pattern for the sake of convenience.

Similarly, the vertical drive beam 170B has a zigzag shape as a whole in which a plurality of vertical beams extending in the direction of the horizontal rotation axis X are included and in which the end portions of the adjacent vertical beams are connected with each other.

For example, the end portion of the first vertical beam counted from the mirror support 161 side and the end portion of the second vertical beam are connected by a turn portion 171Y1. Also, the end portion of the second vertical beam and the end portion of the third vertical beam are connected by a turn portion 171Y2. Also, the end portion of the third vertical beam and the end portion of the fourth vertical beam are connected by a turn portion 171Y3. Also, the end portion of the fourth vertical beam and the end portion of the fifth vertical beam are connected by a turn portion 171Y4. Also, the end portion of the fifth vertical beam and the end portion of the sixth vertical beam are connected by a turn portion 171Y5. Similarly to the above, each turn-back portion is indicated by a satin-like pattern for the sake of convenience.

On the upper surfaces of the vertical drive beams 170A and 170B, the vertical drive sources 171A and 171B are formed for respective vertical beams that are rectangle units that do not include curved portions. The vertical drive source 171A includes a piezoelectric thin film formed on the upper surface of the vertical drive beam 170A, and a first electrode and a second electrode connected to the piezoelectric thin film. The vertical drive source 171B includes a piezoelectric thin film formed on the upper surface of the vertical drive beam 170B, and a first electrode and a second electrode connected to the piezoelectric thin film. Details of the vertical drive sources 171A and 171B will be described later below.

The vertical drive beams 170A and 170B cause the drive sources 171A and 171B that are adjacent for respective adjacent vertical beams to apply drive voltages that have polarities vertically reversed with reference to the drive waveform central value to cause adjacent vertical beams to warp upward and to transmit accumulated vertical movements of the vertical beams to the mirror support 161. For example, the drive waveform may be a sawtooth waveform. The vertical drive beams 170A and 170B cause by this operation the mirror 110 and the mirror support 161 to swing in the direction orthogonal to the direction of the horizontal rotation axis H. This swinging direction is referred to as the vertical direction, and the light reflection of the mirror 110, and the swing axis passing through the center C of the optical reflection surface of the mirror 110 is referred to as the vertical rotation axis V. For example, non-resonant vibration can be used for the vertical drive by the vertical drive beams 170A and 170B.

For example, the vertical drive source 171A includes six vertical drive sources 171A1, 171A2, 171A3, 171A4, 171A5, and 171A6 that are formed on the first to sixth respective vertical beams constituting the vertical drive beam 170A. Further, the vertical drive source 171B includes six vertical drive sources 171B1, 171B2, 171B3, 171B4, 171B5, and 171B6 that are formed on the first to sixth respective vertical beams constituting the vertical drive beam 170B. In this case, by driving the vertical drive sources 171A1, 171B1, 171A3, 171B3, 171A5, and 171B5 with a same waveform voltage, and by driving the vertical drive sources 171A2, 171B2, 171A4, 171B4, 171A6, and 171B6 with a waveform obtained by reversing the above with reference to the drive waveform central value, it is possible to swing the mirror 110 and the mirror support 61 in the vertical direction.

Drive wires used for applying drive voltages to the first electrode and the second electrode of the horizontal drive source 151A are connected to predetermined terminals included in a group of terminals 190A disposed on the fixed frame 180. Drive wires used for applying drive voltages to the first electrode and the second electrode of the horizontal drive source 151B are connected to predetermined terminals included in a group of terminals 190B disposed on the fixed frame 180. Further, drive wires used for applying first electrodes and second electrodes of the vertical drive source 171A are connected to predetermined terminals included in the group of terminals 190A disposed on the fixed frame 180. Drive wires used for applying first electrodes and second electrodes of the vertical drive source 171B are connected to predetermined terminals included in the group of terminals 190B disposed on the fixed frame 180.

Further, the optical scanning unit 100 includes, as horizontal swing angle sensors, piezoelectric sensors 191 and 192 that detect a tilt degree in the horizontal direction (swing angle in the horizontal direction) of the mirror 110 in a state in which drive voltages are applied to the horizontal drive sources 151A and 151B and the mirror 110 swings in the horizontal direction. The piezoelectric sensor 191 is provided on the connection beam 140A, and the piezoelectric sensor 192 is provided on the connection beam 140B.

Further, the optical scanning unit 100 includes piezoelectric sensors 195 and 196 as vertical swing angle sensors that detect a tilt degree of the mirror 110 in the vertical direction (swing angle in the vertical direction) in a state where drive voltages are applied to the vertical drive sources 171A and 171B to swing the mirror 110 in the vertical direction. The piezoelectric sensor 195 is disposed on one of the vertical beams constituting the vertical drive beam 170A and the piezoelectric sensor 196 is disposed on one of the vertical beams constituting the vertical drive beam 170B.

The piezoelectric sensor 191 outputs a current value corresponding to a displacement of the connection beam 140A transmitted from the twist beam 130A according to a tilt degree of the mirror 110 in the horizontal direction. The piezoelectric sensor 192 outputs a current value corresponding to a displacement of the connection beam 140B transmitted from the twist beam 130B according to a tilt degree of the mirror 110 in the horizontal direction. The piezoelectric sensor 195 outputs a current value corresponding to a displacement of the vertical beam of the vertical drive beam 170A on which the piezoelectric sensor 195 is disposed, according to a tilt degree of the mirror 110 in the vertical direction. The piezoelectric sensor 196 outputs a current value corresponding to a displacement of the vertical beam of the vertical drive beam 170B on which the piezoelectric sensor 196 is disposed, according to a tilt degree of the mirror 110 in the vertical direction.

In the embodiment, a tilt degree of the mirror 110 in the horizontal direction is detected by using outputs of the piezoelectric sensors 191 and 192, and a tilt degree of the mirror 110 in the vertical direction is detected by using outputs of the piezoelectric sensors 195 and 196. It should be noted that a tilt degree detection unit that detects a tilt degree of the mirror 110 according to the current values output from the respective piezoelectric sensors may be provided outside the optical scanning unit 100. Also, a drive control unit that controls drive voltages supplied to the horizontal drive sources 151A and 151B and the vertical drive sources 171A and 171B based on a detection result of the tilt degree detection unit may be provided outside the optical scanning unit 100.

The piezoelectric sensors 191, 192, 195 and 196 include piezoelectric thin films and include first electrodes and second electrodes connected to the piezoelectric thin films. Details of the piezoelectric sensors will be described later below. In the embodiment, outputs from the respective piezoelectric sensors are current values of the sensor wires connected to the first electrodes and the second electrodes.

Sensor wires drawn out from the first electrode and the second electrode of the piezoelectric sensor 191 are connected to predetermined terminals included in the group of terminals 190B disposed on the fixed frame 180. Sensor wires drawn out from the first electrode and the second electrode of the piezoelectric sensor 195 are connected to predetermined terminals included in the group of terminals 190A disposed on the fixed frame 180. Further, sensor wires drawn out from the first electrode and the second electrode of the piezoelectric sensor 192 are connected to predetermined terminals included in the group of terminals 190B disposed on the fixed frame 180. Sensor wires drawn out from the first electrode and the second electrode of the piezoelectric sensor 196 are connected to predetermined terminals included in the group of terminals 190B disposed on the fixed frame 180.

The optical scanning unit 100 can be formed by using, for example, a SOI (Silicon On Insulator) substrate that includes a support layer, a BOX (Buried Oxide) layer, and an active layer. For example, members such as the movable frame 160, ribs provided on the back surfaces of the horizontal drive beams 150A and 150B, and ribs provided on the back surfaces of the vertical drive beams 170A and 170B are members formed by patterning from the support layer. Also, members such as the horizontal drive beams 150A and 150B and the vertical drive beams 170A and 170B are members formed by patterning from the active layer and the BOX layer, or the active layer.

Figure 4:
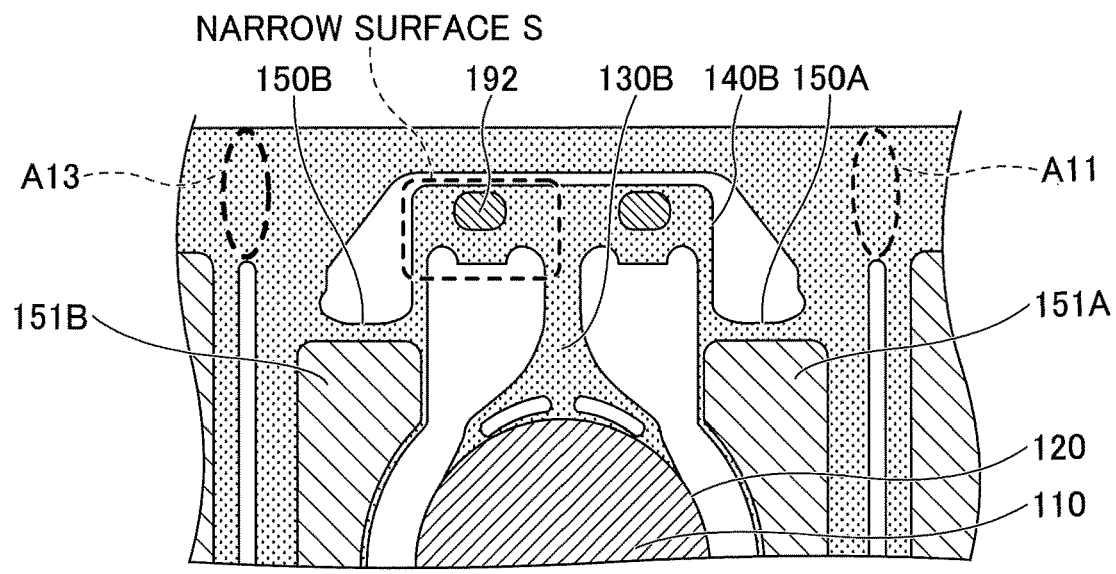
FIG. 4 is a plan view of the upper surface side enlarging a main part illustrating an example of the optical scanning unit of the optical scanning device according to the embodiment.

FIG. 4 is a plan view of the upper surface side enlarging a main part illustrating an example of the optical scanning unit 100 of the optical scanning device 1000 according to the embodiment. FIG. 4 corresponds to an enlarged view of the vicinity of the connection beam 140B in FIG. 3. The twist beam 130B is connected to the mirror support unit 120 that supports the mirror 110. The horizontal drive beams 150A and 150B are connected to the twist beam 130B via connection beams 140B. The Horizontal drive sources 151A and 151B are formed in the horizontal drive beams 150A and 150B. The piezoelectric sensor 192 is formed on the connection beam 140B.

Each of the horizontal drive sources 151A and 15 B are formed by stacking a lower electrode, a lower layer piezoelectric thin film, a middle electrode, an upper layer piezoelectric thin film, and an upper electrode on the surface of the active layer of the SOI substrate via a thermal oxide film. Here, the lower electrode and the upper electrode are grounded (GND), and a signal for driving the horizontal drive beam is input to the middle electrode. That is, the lower electrode, the lower layer piezoelectric thin film, and the middle electrode constitute one piezoelectric element, the middle electrode, the upper layer piezoelectric thin film, and the upper electrode constitute another piezoelectric element, and these piezoelectric elements are connected in parallel. As compared with a case of a configuration in which a piezoelectric thin film has a single layer, that is, a case of a configuration of one piezoelectric element, it is possible to improve the drive efficiency of the horizontal drive unit. Each of the vertical drive sources 171A and 171B has a similar configuration. The drive efficiency can be improved by a configuration in which two piezoelectric elements are connected in parallel. This enables low voltage drive, suppresses element breakage due to withstand voltage, and reduces the load on a step-up IC or a circuit.

When the above described piezoelectric sensor having the structure in which the lower electrode, the lower layer piezoelectric thin film, the middle electrode, the upper layer piezoelectric thin film, and the upper electrode are stacked is used as the piezoelectric sensor 192, the piezoelectric sensor 192 and the horizontal drive sources 151A and 151B and the vertical drive sources 171A and 171B can be formed at the same time. However, the connection beam 140B is a very small beam, and the area where the piezoelectric sensor 192 is formed is a narrow surface S. The narrow surface S is narrower than the area where the horizontal drive sources 151A and 151B and the vertical drive sources 171A and 171B are formed. Therefore, for the piezoelectric sensor 192, it is difficult to perform wiring similarly to the horizontal drive sources 151A and 151B and the vertical drive sources 171A and 171B. That is, it is difficult to connect the piezoelectric element consisting of the lower electrode, the lower layer piezoelectric thin film, and the middle electrode and the piezoelectric element consisting of the middle electrode, the upper layer piezoelectric thin film, and the upper electrode in parallel. Therefore, a configuration in which the lower electrode is grounded (GND), the middle electrode is disconnected (floating state), and a sensor signal is taken out from the upper electrode is used. That is, the lower electrode, the lower layer piezoelectric thin film, and the middle electrode constitute one piezoelectric element, the middle electrode, the upper layer piezoelectric thin film, and the upper electrode constitute another piezoelectric element, and a configuration in which these two piezoelectric elements are connected in series is used. In this case, for example, because the thickness of the apparent piezoelectric thin film is doubled with respect to a case without a series connection, the sensor output voltage is ½ of the case without a series connection.

In the optical scanning device 1000 according to the present embodiment, a structure in which a lower electrode, a piezoelectric thin film, and an upper electrode are stacked is used as a piezoelectric element used as the piezoelectric sensor 192. Here, the upper electrode of the piezoelectric sensor 192 is an electrode located at a position to be a middle electrode in the configuration in which the above described two piezoelectric elements are connected in series. The piezoelectric thin film of the piezoelectric sensor 192 is an electrode located at a position to be a lower layer piezoelectric thin film in the configuration in which the above described two piezoelectric elements are connected in series. As compared with a configuration in which two piezoelectric elements are connected in series, the thickness of the piezoelectric thin film can be reduced to ½ and the output of the piezoelectric sensor can be doubled. The same applies to the piezoelectric sensors 191, 195, and 196 other than the piezoelectric sensor 192. In other words, each of the piezoelectric sensors 191, 195, and 196 may have a configuration similar to that of the piezoelectric sensor 192 described above.

Figure 5:
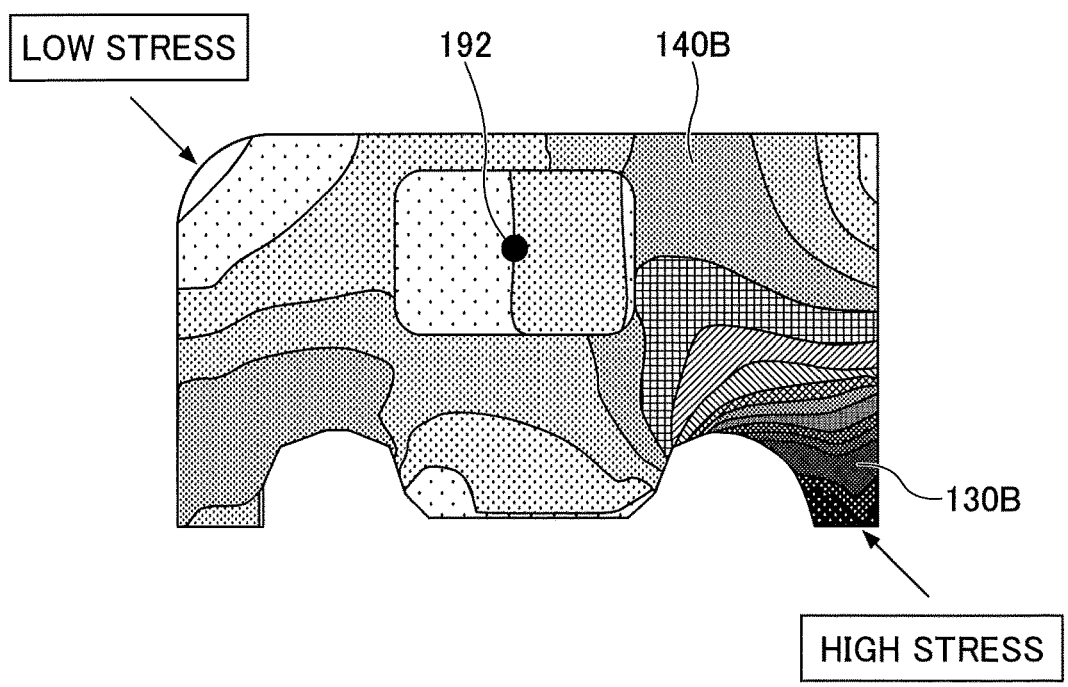
FIG. 5 is a stress distribution diagram by simulation of the optical scanning unit of the optical scanning device according to the embodiment.

FIG. 5 is a stress distribution diagram by simulation of the optical scanning unit 100 of the optical scanning device 1000 according to the embodiment. FIG. 5 illustrates a portion corresponding to the narrow surface S in FIG. 4. In the simulation, the stress generated on the narrow surface S when a predetermined voltage was applied to horizontal drive sources to horizontally drive was found. In FIG. 5, it is indicated that as the gradation thickens, the stress increases, and as the gradation thins, the stress decreases. At, the portion of the twist beam 130B, the stress is large. That is, the stress at the corner portion farthest from the twist beam 130B is the smallest. At the area of the piezoelectric sensor 192, the stress is small according to the portion with the lowest stress within those illustrated in FIG. 5.

Figure 6:
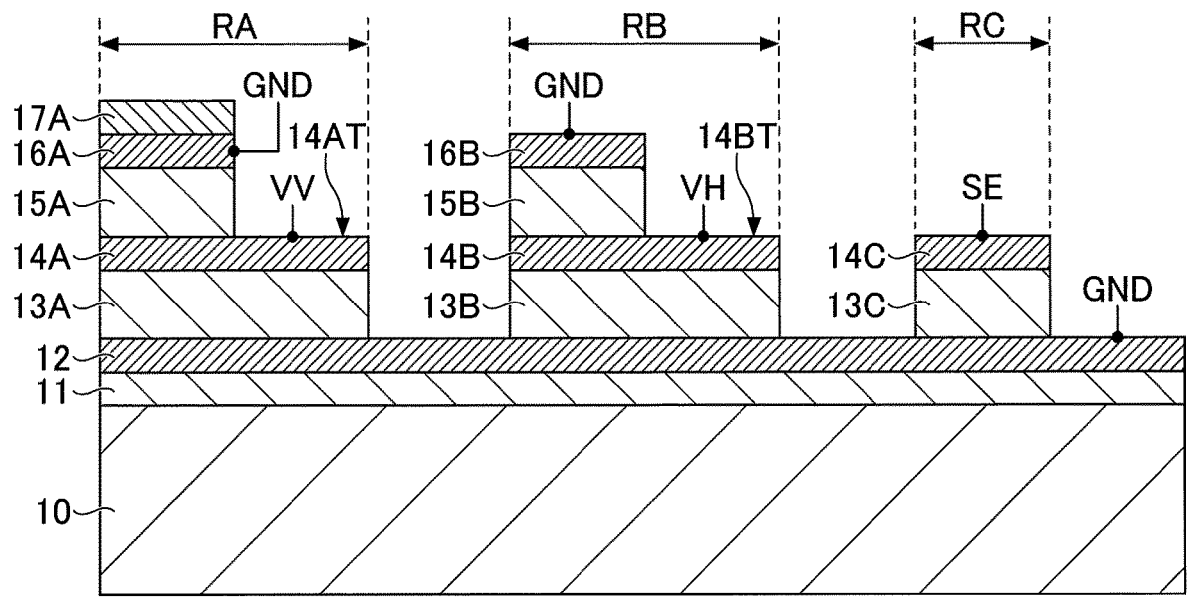
FIG. 6 is a cross-sectional view illustrating the optical scanning unit of the optical scanning device according to the embodiment.

FIG. 6 is a cross-sectional view illustrating the optical scanning unit 100 of the optical scanning device 1000 according to the present embodiment. FIG. 6 illustrates a vertical drive source area RA, a horizontal drive source area RB, and a piezoelectric sensor area RC formed on a SOI substrate 10. A MEMS structure of the SOI substrate 10 is not illustrated in FIG. 6. In the vertical drive source area RA, the horizontal drive source area RB, and the piezoelectric sensor area RC, a thermal oxide film 11 and a lower electrode 12 are formed on the SOI substrate 10. In the vertical drive source area RA, a lower layer piezoelectric thin film 13A, a middle electrode 14A, an upper layer piezoelectric thin film 15A, an upper electrode 16A, and a coating film (counter film) 17A are stacked as upper layers for the lower electrode 12. Part of the upper layer piezoelectric thin film 15A, the upper electrode 16A, and the coating film (counter film) 17A is removed, and the middle electrode 14A is exposed and used as a terminal 14AT. The lower electrode 12 and the upper electrode 16A are grounded (GND), and a vertical drive signal VV is applied to the middle electrode 14A.

In the horizontal drive source area RB, a lower layer piezoelectric thin film 13B, a middle electrode 14B, an upper layer piezoelectric thin film 15B, and an upper electrode 16B are stacked as upper layers for the lower electrode 12. Part of the upper layer piezoelectric thin film 15B and the upper electrode 16B is removed, and the middle electrode 14B is exposed and used as a terminal 14BT. The lower electrode 12 and the upper electrode 16B are grounded (GND), and a horizontal drive signal VH is applied to the middle electrode 14B.

In the piezoelectric sensor area RC, a piezoelectric thin film 13C and an upper electrode 14C are stacked as upper layers for the lower electrode 12. The lower electrode 12 is grounded (GND), and a sensor signal SE is output from the upper electrode 14C.

For the lower layer piezoelectric thin films 13A and 13B, the piezoelectric thin film 13C, and the upper layer piezoelectric thin films 15A and 15B, Pb(Zr, Ti)O$_3$ (lead zirconate titanate: called PZT) that is a lead-based material can be used. In this case, an additive such as La$_2$O$_3$, Nd$_2$O$_3$, Nd$_2$O$_5$, Ta$_2$O$_5$, or WO$_3$ may be added to PZT. Also, as a piezoelectric material, for example, a lead-free material such as a BaTiO$_3$ type, KNbO$_3$—NaNbO$_3$—LiNbO$_3$ type, or (Bi$_{1/2}$Na$_{1/2}$)TiO$_3$ type lead-free piezoelectric ceramics may be used. The lower electrode 12, the middle electrodes 14A and 14B, the upper electrode 14C, and the upper electrodes 16A and 16B are conductive layers made of a conductive material, and, for example, a stacked film in which LaNiO$_3$/Pt/LaNiO$_3$ is stacked in this order can be used. In this case, the thickness of each LaNiO$_3$ can be, for example, in a range of approximately 10 nm to 100 nm. Also, the thickness of Pt can be, for example, in a range of from approximately 50 nm to 200 nm. Examples of electrode configurations other than the above include metals such as Au and Pt, metal oxides such as LaNiO$_3$, SrRuO$_3$, and IrO$_3$, and combinations of these. Also, the coating film (counter film) 17A is made of TiW (titanium tungsten) or the like.

Because a piezoelectric thin film is a ferroelectric substance and a structure in which the piezoelectric thin film is interposed between electrodes is equivalent to a capacitor, a generated electric charge Q of a piezoelectric sensor used as the piezoelectric sensor is proportional to the capacitance C.

$$Q = CV \quad (1)$$

From the above equation (1), the generated charge increases as the capacitance increases. On the other hand, the generated charge Q is proportional to the stress σ applied to the sensor from the outside.

$$Q = a \times \sigma \, (a \text{ is a proportional constant}) \quad (2)$$

From the above equations (1) and (2), the following equation is obtained.

$$CV \propto \sigma \quad (3)$$

From the above equations (1) to (3), as the capacitance C increases or as the externally applied stress σ increases, the generated charge Q increases and the output of the sensor increases. Increasing the externally applied stress σ to the sensor increases the element breakage risk. Therefore, it is impossible to carelessly increase the externally applied stress σ. Therefore, in order to increase the generated charge Q, it is required to increase the capacitance C. Assuming that the permittivity of the piezoelectric thin film is ε, the area of the sensor is S, and the film thickness of the piezoelectric thin film is d, the capacitance C is expressed by the following equation.

$$C=\varepsilon \times S/d \qquad (4)$$

From the above equation (4), in order to increase the capacitance C, the following methods can be considered.

(A) Increase the permittivity ε of the film material of the piezoelectric thin film. Although a piezoelectric thin film material uses a material having a low d constant of low voltage/large displacement as a drive source, in general, a material having a high d constant has a high permittivity ε, and in a piezoelectric thin film also serving as a drive source, it is difficult to further increase the permittivity ε of the piezoelectric thin film material.

(B) Increase the piezoelectric sensor area S. Increasing the area is also a means for increasing the capacitance C. However, there is a stress distribution on the sensor surface, and when a piezoelectric sensor is disposed at a small stress portion, the distortion of the piezoelectric sensor is canceled within the area by increasing the area, and in an actual element, the generated charge Q does not increase as expected. In the present embodiment, as illustrated in FIG. 5, because the piezoelectric sensor is provided at a small stress portion, it is considered difficult to increase the capacitance C by increasing the area S of the piezoelectric sensor.

(C) Reduce the thickness d of the piezoelectric thin film. The thickness d of the piezoelectric thin film is inversely proportional to the capacitance C, and the capacitance C increases due to a decrease in the thickness d of the piezoelectric thin film.

As described above, in a case where a piezoelectric thin film is used as a piezoelectric sensor, by reducing the thickness d of the piezoelectric thin film, the capacitance C is increased and the sensor output is increased. Thereby, the S/N ratio of the sensor signal can be improved. The thickness d of the piezoelectric thin film in the piezoelectric sensor of the optical scanning device according to the present embodiment corresponds to ½ of that in a case of connecting two piezoelectric elements in series. Thereby, the capacitance C can be doubled, the sensor output can be doubled, and the S/N ratio can be improved.

<Method for Producing Optical Scanning Device>

Figure 7:
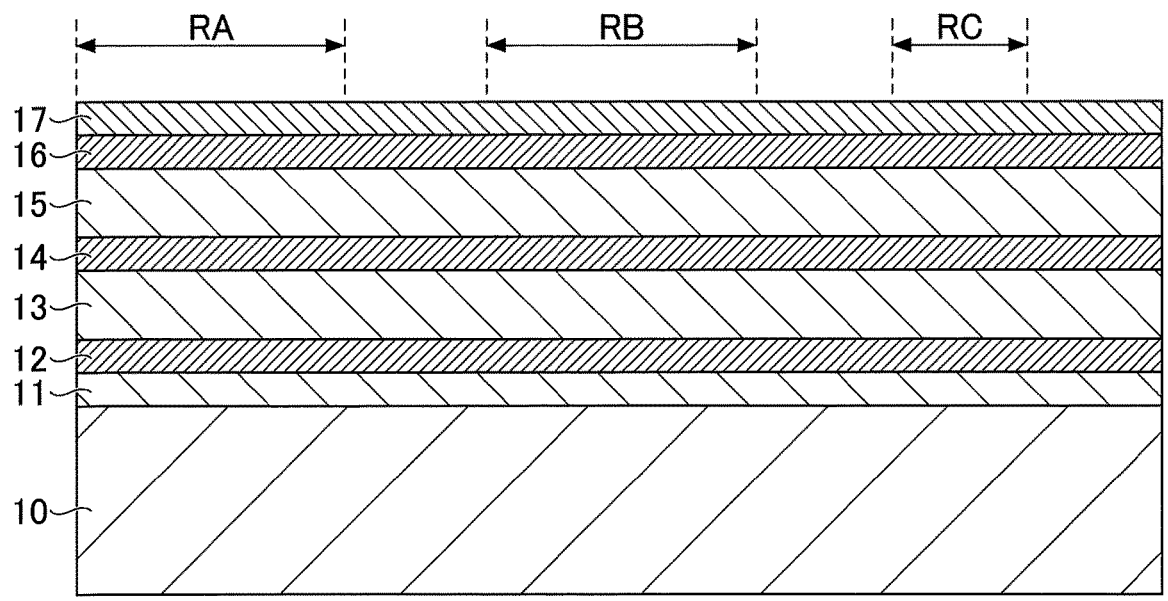
FIG. 7 is a cross-sectional view illustrating an example of a step of a method for producing the optical scanning unit of the optical scanning device according to the embodiment.

FIG. 7 is a cross-sectional view illustrating an example of a step of a method for producing the optical scanning unit 100 of the optical scanning device 1000 according to the present embodiment. First, for example, in the vertical drive source area RA, the horizontal drive source area RB, and the piezoelectric sensor area RC, the thermal oxide film 11 is formed on the surface of the SOI substrate 10. As upper layers for the thermal oxide film 11, the lower electrode 12 is formed by a PVD (Physical Vapor Deposition) method, and the lower layer piezoelectric thin film 13 is further formed by a CSD (Chemical Solution Deposition) method. As upper layers for the lower layer piezoelectric thin film 13, the middle electrode 14 is formed by a PVD method, and the upper layer piezoelectric thin film 15 is further formed by a CSD method. As upper layers for the upper layer piezoelectric thin film 15, the upper electrode 16 and the coating film (counter film) 17 are formed by a PVD method. The lower layer piezoelectric thin film 13 and the upper layer piezoelectric thin film 15 are piezoelectric thin films such as PZT. The lower electrode 12, the middle electrode 14, and the upper electrode 16 are conductive layers made of a conductive material.

Figure 8:
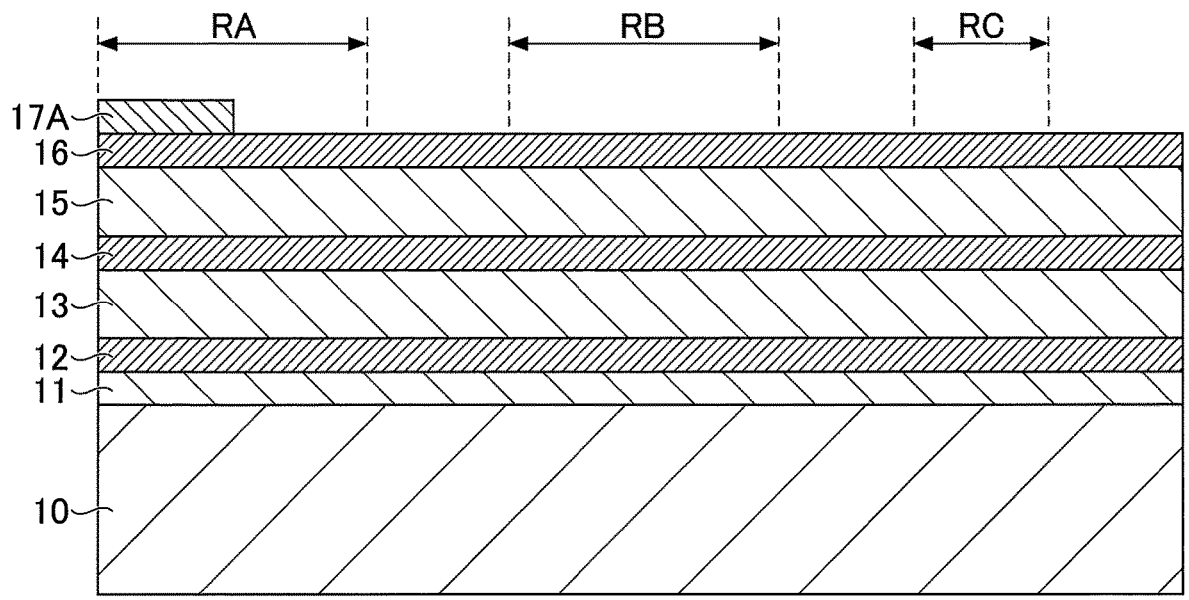
FIG. 8 is a cross-sectional view illustrating an example of a step of the method for producing the optical scanning unit of the optical scanning device according to the embodiment.

FIG. 8 is a cross-sectional view illustrating an example of a step of the method for producing the optical scanning unit 100 of the optical scanning device 1000 according to the present embodiment. For example, by pattern-forming a photoresist film by a photolithography process and performing a dry etching process such as RIE (Reactive Ion Etching), while keeping the coating film (counter film) 17A in the vertical drive source area RA other than a portion to be the terminal 14AT, the other portion of the coating film (counter film) 17 is removed.

Figure 9:
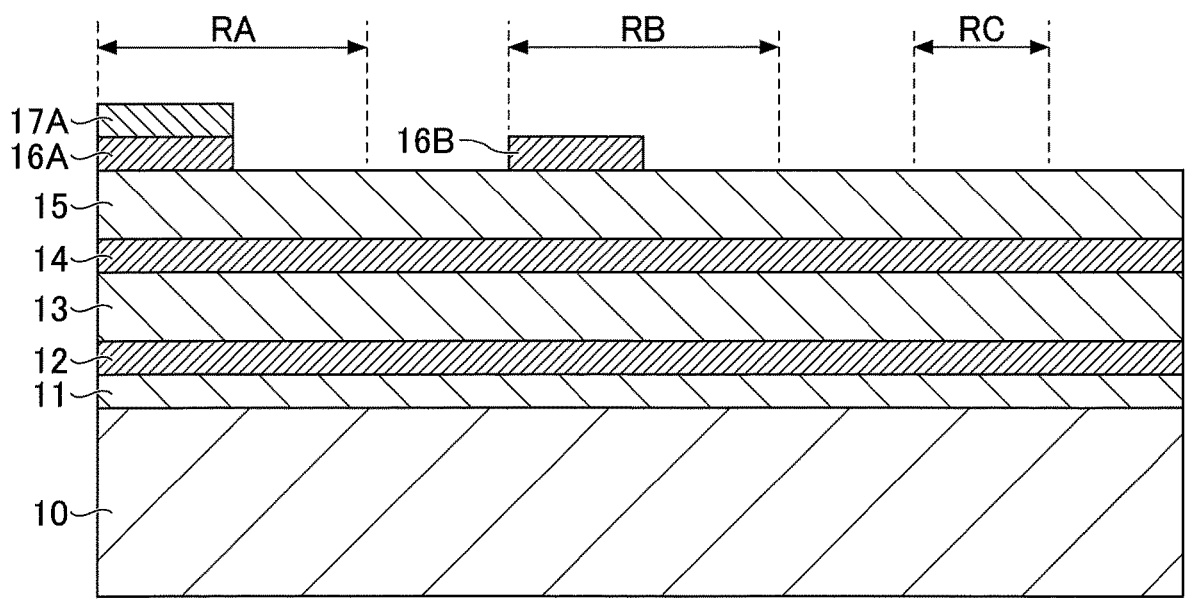
FIG. 9 is a cross-sectional view illustrating an example of a step of the method for producing the optical scanning unit of the optical scanning device according to the embodiment.

FIG. 9 is a cross-sectional view illustrating an example of a step of the method for producing the optical scanning unit 100 of the optical scanning device 1000 according to the present embodiment. For example, by pattern-forming a photoresist film by a photolithography process and performing a dry etching process such as RIE, while keeping the upper electrodes 16A and 16B in the vertical drive source area RA other than a portion to be the terminal 14AT and in the horizontal drive source area RB other than terminal 14BT and, the other portion of the upper electrode 16 is removed.

Figure 10:
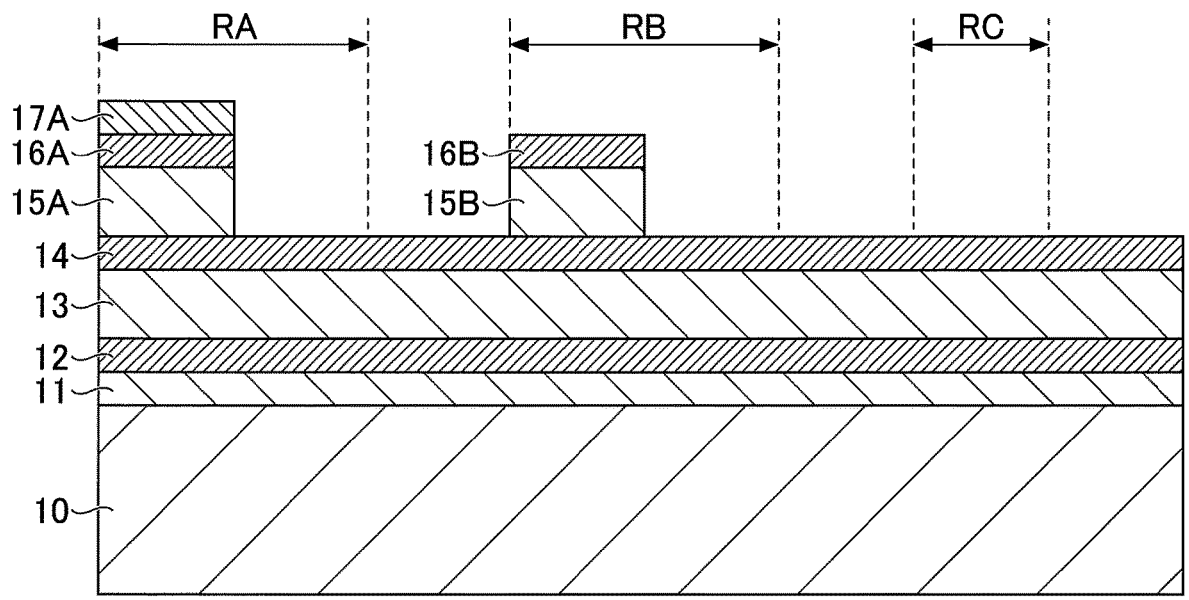
FIG. 10 is a cross-sectional view illustrating an example of a step of the method for producing the optical scanning unit of the optical scanning device according to the embodiment.

FIG. 10 is a cross-sectional view illustrating an example of a step of the method for producing the optical scanning unit 100 of the optical scanning device 1000 according to the present embodiment. For example, by pattern-forming a photoresist film by a photolithography process and performing a dry etching process such as RIE, while keeping the upper layer piezoelectric thin films 15A and 15B in the vertical drive source area RA other than a portion to be the terminal 14AT and in the horizontal drive source area RB other than terminal 14BT and, the other portion of the upper layer piezoelectric thin film 15 is removed.

Figure 11:
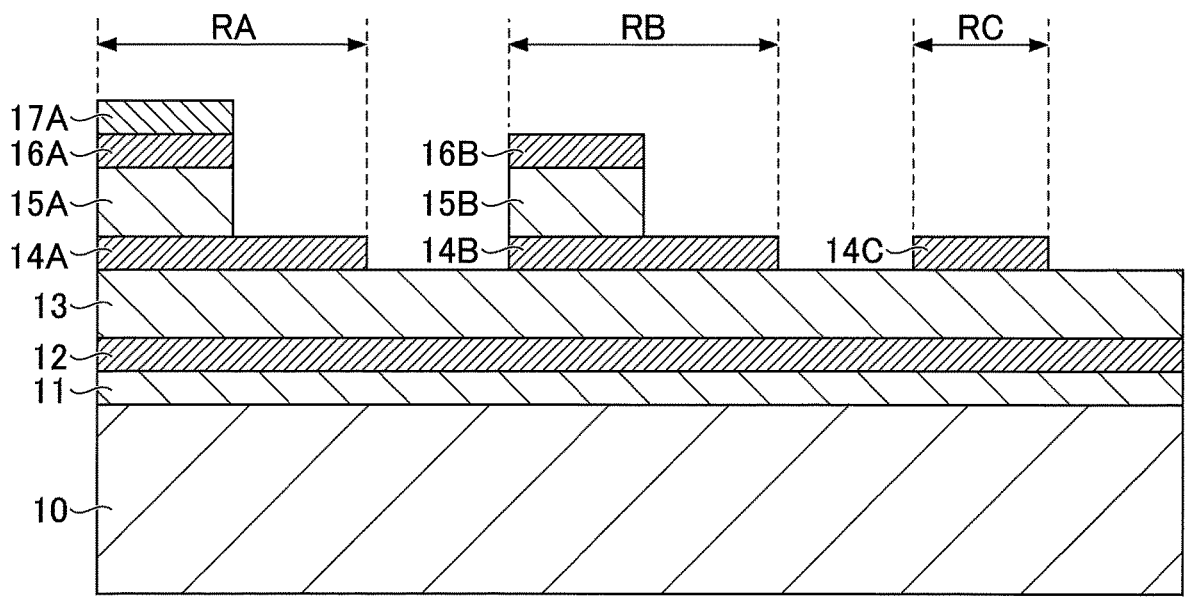
FIG. 11 is a cross-sectional view illustrating an example of a step of the method for producing the optical scanning unit of the optical scanning device according to the embodiment.

FIG. 11 is a cross-sectional view illustrating an example of a step of the method for producing the optical scanning unit 100 of the optical scanning device 1000 according to the present embodiment. For example, by pattern-forming a photoresist film by a photolithography process and performing a dry etching process such as RIE, the middle electrode 14 other than the vertical drive source area RA, the horizontal drive source area RB, and the piezoelectric sensor area RC is removed. As a result, the middle electrodes 14A and 14B remain in the vertical drive source area RA and the horizontal drive source area RB. In the piezoelectric sensor area RC, the upper electrode 16 and the upper layer piezoelectric thin film 15 are removed, and the remaining electrode is referred to as an upper electrode 14C.

Figure 12:
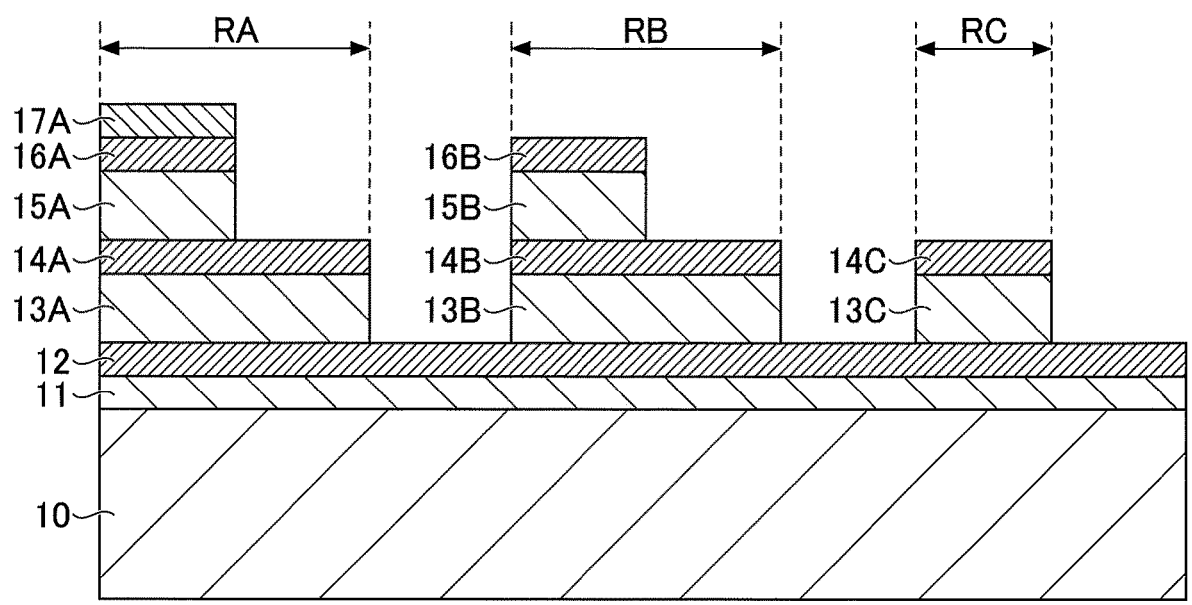
FIG. 12 is a cross-sectional view illustrating an example of a step of the method for producing the optical scanning unit of the optical scanning device according to the embodiment.

FIG. 12 is a cross-sectional view illustrating an example of a step of the method for producing the optical scanning unit 100 of the optical scanning device 1000 according to the present embodiment. For example, by pattern-forming a photoresist film by a photolithography process and performing a dry etching process such as RIE, the lower layer piezoelectric thin film 13 other than the vertical drive source area RA, the horizontal drive source area RB, and the piezoelectric sensor area RC is removed. As a result, the lower layer piezoelectric thin films 13A and 13B remain in the vertical drive source area RA and the horizontal drive source area RB. In the piezoelectric sensor area RC, the upper electrode 16 and the upper layer piezoelectric thin film 15 are removed, and the remaining lower layer piezoelectric thin film is referred to as a piezoelectric thin film 13C.

As described above, it is possible to produce the optical scanning device having the piezoelectric element having the configuration shown in FIG. 6. According to the above-described method for producing the optical scanning device, it is possible to produce an optical scanning device that can twice the sensor output and can improve the S/N ratio. It can be realized without increasing the production steps as compared with a case of a configuration where the two piezoelectric elements are connected in series while remaining an upper layer piezoelectric thin film and an upper electrode in a piezoelectric sensor area RC.

Although a preferred embodiment has been described above, the present invention is not limited to the embodiment described above, and various variations and substitutions may be made for the embodiment described above without departing from the scope of the present invention. Although, in the above described embodiment, a stack structure in which two layers of piezoelectric thin films are stacked is used as a drive source of a drive beam, and a single layer of a piezoelectric thin film is used as a piezoelectric sensor, the present invention is not limited to this, and the number of piezoelectric thin films of a piezoelectric sensor may be made smaller than the number of piezoelectric thin films of a drive source.

What is claimed is:

1. An optical scanning device comprising:
   a mirror that has an optical reflection surface;
   a mirror support unit configured to support the mirror;
   a pair of drive beams arranged on both sides of the mirror support unit and connected such that the mirror support unit is swingable;
   a drive source provided on the drive beams and configured to swing the mirror support unit, the drive source including a stack structure of a plurality of piezoelectric thin films; and
   a piezoelectric sensor formed on a connection beam connected to the drive source or the drive beams, a number of piezoelectric thin films included in the piezoelectric sensor being less than a number of the piezoelectric thin films included in the drive source,
   wherein the drive source includes a first electrode, a first piezoelectric thin film on the first electrode, a second electrode on the first piezoelectric thin film, a second piezoelectric thin film on the second electrode, and a third electrode on the second piezoelectric thin film,
   wherein the piezoelectric sensor includes a first electrode, a second electrode, and a first piezoelectric thin film between the first electrode and second electrode, and
   wherein respective materials of the first electrode, the first piezoelectric thin film, and the second electrode of the drive source are the same as respective materials of the first electrode, the first piezoelectric thin film, and the second electrode of the piezoelectric sensor.

2. The optical scanning device according to claim 1, further comprising:
   a movable frame provided on an outer periphery of the mirror support unit; and
   a twist beam connected to the mirror support unit such that the mirror support unit is swingable;
   wherein, as the drive beams, a pair of first drive beams arranged on both sides of the mirror support unit, connected to an inner periphery of the movable frame, and connected to the twist beam via the connection beam, are included, and
   wherein, as the piezoelectric sensor, a first piezoelectric sensor formed on the connection beam is included.

3. The optical scanning device according to claim 2,
   wherein, as the drive beams, a pair of second drive beams arranged on both sides of the mirror support unit and connected to the outer periphery of the movable frame and to a fixed frame are included, and
   wherein, as the piezoelectric sensor, a second piezoelectric sensor formed on the second drive beams is included.

4. The optical scanning device according to claim 3, wherein the second drive beams have a zigzag shape as a whole in which a plurality of beams extending in a direction vertical to a predetermined axis are included and in which end portions of the beams adjacent with each other are connected.

5. The optical scanning device according to claim 1, further comprising:
   a movable frame provided on an outer periphery of the mirror support unit; and
   wherein, as the drive beams, a pair of second drive beams arranged on both sides of the mirror support unit and connected to the outer periphery of the movable frame and to a fixed frame are included, and
   wherein, as the piezoelectric sensor, a second piezoelectric sensor formed on the second drive beams is included.

6. A method for producing an optical scanning device, the optical scanning device including a mirror that has an optical reflection surface; a mirror support unit configured to support the mirror; a pair of drive beams arranged on both sides of the mirror support unit and connected such that the mirror support unit is swingable; a drive source provided on the drive beams and configured to swing the mirror support unit, the drive source including a stack structure of a plurality of piezoelectric thin films; and a piezoelectric sensor formed on a connection beam connected to the drive source or the drive beams, a number of piezoelectric thin films included in the piezoelectric sensor being less than a number of the piezoelectric thin films included in the drive source, the method comprising:
   in a drive source formation area and a piezoelectric sensor formation area of a SOI substrate including a support layer, a buried layer, and an active layer, stacking a first conductive layer, a first piezoelectric thin film, a second conductive layer, a second piezoelectric thin film, and a third conductive layer in order;
   in the piezoelectric sensor formation area, removing the third conductive layer and the second piezoelectric thin film to form the piezoelectric sensor in which the first conductive layer, the first piezoelectric thin film, and the second conductive layer are stacked; and
   in the drive source formation area, removing the third conductive layer and the second piezoelectric thin film at part of the drive source formation area to form a drive source terminal and to form the drive source in which the first conductive layer, the first piezoelectric thin film, the second conductive layer, the second piezoelectric thin film, and the third conductive layer are stacked.

7. The method for producing the optical scanning device according to claim 6,
   wherein the optical scanning device includes a movable frame provided on an outer periphery of the mirror support unit; and a twist beam connected to the mirror support unit such that the mirror support unit is swingable, wherein the optical scanning device includes, as the drive beams, a pair of first drive beams arranged on both sides of the mirror support unit, connected to an inner periphery of the movable frame, and connected to the twist beam via the connection beam, and wherein, in the piezoelectric sensor formation area, a first piezoelectric sensor is formed on the connection beam by removing the third conductive layer and the second piezoelectric thin film to form the piezoelectric sensor in which the first conductive layer, the first piezoelectric thin film, and the second conductive layer are stacked.

8. The method for producing the optical scanning device according to claim 6, wherein the optical scanning device includes a movable frame provided on an outer periphery of the mirror support unit, wherein the optical scanning device includes, as the drive beams, a pair of second drive beams arranged on both sides of the mirror support unit and connected to the outer periphery of the movable frame and to a fixed frame, and wherein, in the piezoelectric sensor formation area, a second piezoelectric sensor is formed on the second drive beams by removing the third conductive layer and the second piezoelectric thin film to form the piezoelectric sensor in which the first conductive layer, the first piezoelectric thin film, and the second conductive layer are stacked.

9. The method for producing the optical scanning device according to claim 7, wherein the optical scanning device includes, as the drive beams, a pair of second drive beams arranged on both sides of the mirror support unit and connected to the outer periphery of the movable frame and to a fixed frame, and wherein, in the piezoelectric sensor formation area, a second piezoelectric sensor is formed on the second drive beams by removing the third conductive layer and the second piezoelectric thin film to form the piezoelectric sensor in which the first conductive layer, the first piezoelectric thin film, and the second conductive layer are stacked.

\* \* \* \* \*